United States Patent
Chi et al.

(10) Patent No.: US 9,515,648 B2
(45) Date of Patent: Dec. 6, 2016

(54) APPARATUS AND METHOD FOR HOST POWER-ON RESET CONTROL

(75) Inventors: Steve Chi, Cupertino, CA (US); Ekram Bhuiyan, San Jose, CA (US)

(73) Assignee: SanDisk Technologies LLC, Plano, TX (US)

(*) Notice: Subject to any disclaimer, the term of this patent is extended or adjusted under 35 U.S.C. 154(b) by 775 days.

(21) Appl. No.: 12/748,345

(22) Filed: Mar. 26, 2010

(65) Prior Publication Data

US 2011/0234268 A1    Sep. 29, 2011

(51) Int. Cl.
*H03L 7/00* (2006.01)
*H03K 17/22* (2006.01)
*G06F 1/24* (2006.01)

(52) U.S. Cl.
CPC ............... *H03K 17/223* (2013.01); *G06F 1/24* (2013.01)

(58) Field of Classification Search
None
See application file for complete search history.

(56) References Cited

U.S. PATENT DOCUMENTS

| | | | |
|---|---|---|---|
| 5,920,182 A * | 7/1999 | Migliavacca | 323/282 |
| 6,507,229 B1 * | 1/2003 | Aoyama | 327/281 |
| 6,683,481 B1 | 1/2004 | Zhou et al. | 327/143 |
| 6,849,958 B2 * | 2/2005 | Madurawe | 257/67 |
| 7,863,884 B1 * | 1/2011 | Carper | 323/313 |
| 2005/0134334 A1 | 6/2005 | Mikyska | 327/143 |
| 2008/0158220 A1 | 7/2008 | Huang et al. | 345/213 |

* cited by examiner

*Primary Examiner* — Daniel Puentes
(74) *Attorney, Agent, or Firm* — Martine Penilla Group, LLP (57) ABSTRACT

A host power-on reset control circuit includes a comparator connected to receive both a divided version of a supply voltage and a reference voltage. The comparator generates and outputs a high digital state signal when the divided version of the supply voltage is at least as large as the reference voltage. The control circuit includes an output node connected to transmit a power-on reset control signal. The control circuit includes pulldown circuitry connected between the comparator output and the output node. The pulldown circuitry maintains the output node at a reset voltage level as the supply voltage rises to a host operational level, based on a signal present at the comparator output. The control circuit includes pullup circuitry connected between the supply voltage and the output node. The pullup circuitry maintains the output node at a non-reset voltage level after the supply voltage has risen to the host operational level.

12 Claims, 4 Drawing Sheets

APPARATUS AND METHOD FOR HOST POWER-ON RESET CONTROL

BACKGROUND

In a mixed signal circuit, i.e., a circuit that includes both analog and digital signals, a Power-On Reset (POR) circuit is used to ensure that digital logic activity is held at power-up until a supply voltage is ready. During a period of time when the supply voltage is rising to an operational supply voltage level, the POR circuit functions to hold the digital logic in a reset state. More specifically, the POR circuit operates to sense the supply voltage and release a digital logic reset signal when the supply voltage reaches the operational supply voltage level. Therefore, the POR circuit provides a master reset signal for entire mixed signal circuit. If the POR circuit releases the digital logic reset signal too early, the digital logic may operate incorrectly because its supply voltage is not adequate. Therefore, it is necessary to have a POR circuit that operates without fault, regardless of supply voltage behavior during power-up and/or environmental conditions, such as temperature variations.

SUMMARY

In one embodiment, a host power-on reset control circuit is disclosed. The host power-on reset control circuit includes a comparator that is electrically connected to receive a divided version of a supply voltage at a first input and a reference voltage at a second input. The comparator is defined to generate a high digital state signal at a comparator output when the divided version of the supply voltage at the first input is at least as large as the reference voltage at the second input. The host power-on reset control circuit also includes an output node electrically connected to transmit a power-on reset control signal. The host power-on reset control circuit further includes pulldown circuitry that is electrically connected between the comparator output and the output node. The pulldown circuitry is defined to maintain the output node at a reset voltage level as the supply voltage rises to a host operational level, based on a digital state signal present at the comparator output. The host power-on reset control circuit also includes pullup circuitry that is electrically connected between the supply voltage and the output node. The pullup circuitry is defined to maintain the output node at a non-reset voltage level after the supply voltage has risen to the host operational level.

In another embodiment, a system is disclosed for power-on reset control. The system includes a bandgap reference voltage generator defined to receive a supply voltage as an input and generate a plurality of reference voltages based on the received supply voltage. The system also includes a host power-on reset control circuit defined to receive the supply voltage as a first input voltage and a reference voltage from the bandgap reference voltage generator as a second input voltage. The host power-on reset control circuit is defined to compare a divided version of the supply voltage to the reference voltage, so as to control an output node electrically connected to transmit a power-on reset control signal.

In another embodiment, a method is disclosed for controlling power-on reset of an electronic device. The method includes an operation for activating a supply voltage, whereby the supply voltage increases from zero to an operating voltage level over a period of time. The method also includes an operation for dividing a current state of the supply voltage to obtain a divided version of the current state of the supply voltage. The method further includes an operation for comparing the divided version of the current state of the supply voltage to a reference voltage. An output node is electrically connected to a ground reference potential while the divided version of the current state of the supply voltage is less than the reference voltage. The output node is electrically connected to transmit a power-on reset control signal. Connection of the output node to the ground reference potential maintains the power-on reset control signal in a reset state. The method also includes electrically isolating the output node from the ground reference potential when the divided version of the current state of the supply voltage becomes greater than or equal to the reference voltage. Isolation of the output node from the ground reference potential allows the output node to maintain a positive voltage level that is indicative of a non-reset state of the power-on reset control signal.

Other aspects and advantages of the invention will become more apparent from the following detailed description, taken in conjunction with the accompanying drawings, illustrating by way of example the present invention.

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
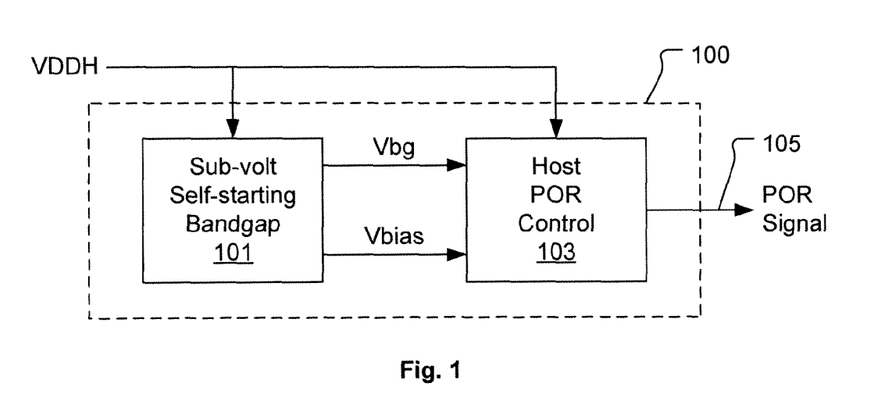
FIG. 1 shows a system level diagram of a Power-On Reset (POR) control circuit, in accordance with one embodiment of the present invention.

FIG. 1 shows a system 100 for Power-On Reset (POR) control, in accordance with one embodiment of the present invention. The system 100 includes a bandgap reference voltage generator 101 defined to receive a supply voltage VDDH as an input and generate a plurality of reference voltages (Vbg, Vbias) based on the received supply voltage VDDH. The system 100 also includes a host POR control circuit 103 defined to receive the supply voltage VDDH as a first input voltage and the plurality of reference voltages (Vbg, Vbias) from the bandgap reference voltage generator 101 as second input voltages. The host POR control circuit 103 is defined to compare a divided version of the supply voltage VDDH to the reference voltage (Vbg) to control an output node 105, which is electrically connected to transmit a POR control signal to host/core circuitry. More specifically, the host POR control circuit 103 will release a reset signal to host/core circuitry by setting a digital state at output node 105.

As discussed in more detail below with regard to FIG. 2, the bandgap reference voltage generator 101 is defined to generate the plurality of reference voltages (Vbg, Vbias)

before the host POR control circuit 103 begins comparing the divided version of the supply voltage VDDH to the reference voltage (Vbg). The bandgap reference voltage generator 101 is a sub-volt bandgap reference voltage generator and is defined to self-start when the received supply voltage VDDH reaches a self-start voltage level below 1.0 volt (V). In one embodiment, the supply voltage VDDH should reach 1.4 V before the host POR control circuit 103 releases the reset signal to host/core circuitry. In this embodiment, the sub-volt bandgap reference voltage generator 101 will give at least 400 millivolts (mV) of margin relative to when the host POR control circuit 103 needs to release the reset signal.

Figure 2:
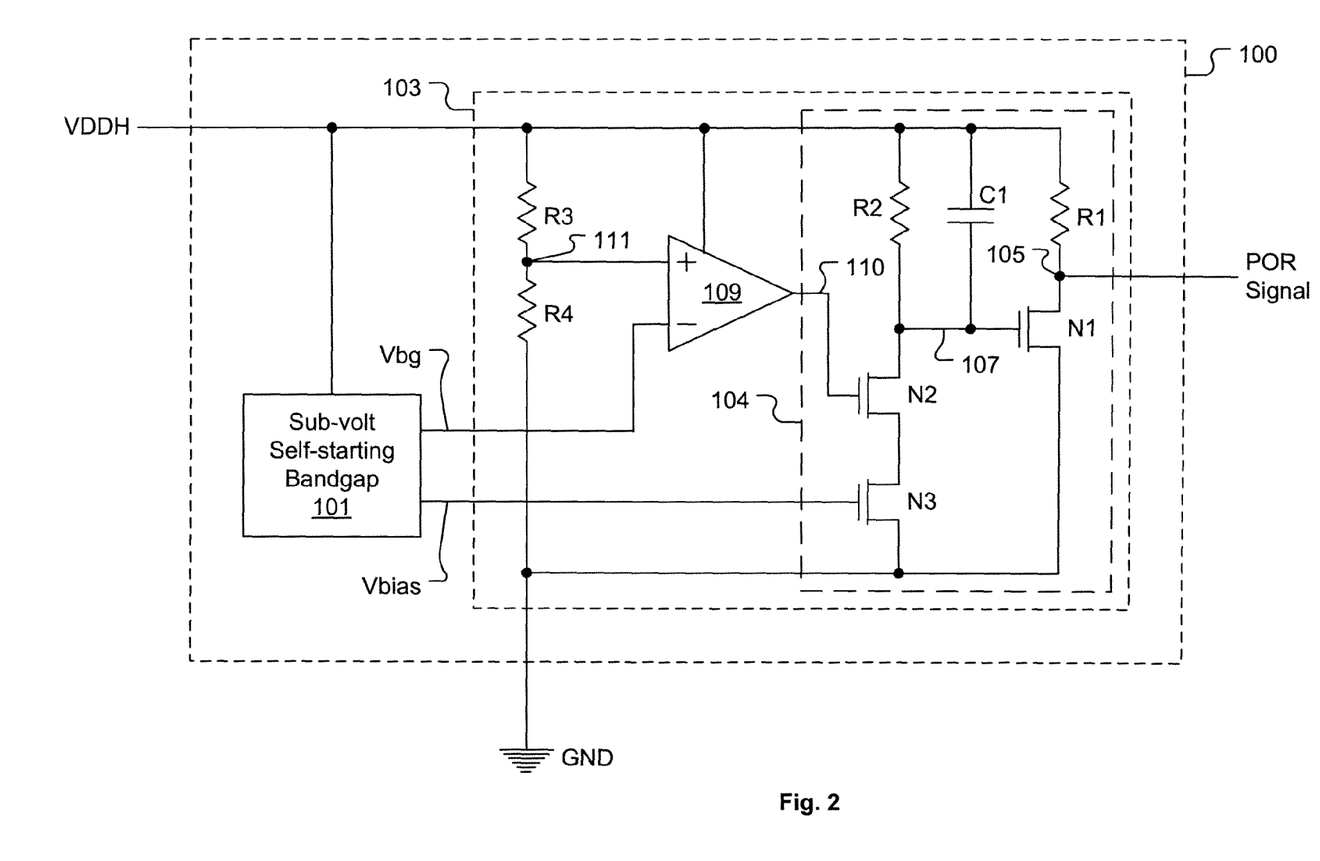
FIG. 2 shows an implementation level diagram of the POR control circuit of FIG. 1, in accordance with one embodiment of the present invention.

FIG. 2 shows an implementation level diagram of the host POR control circuit 103 of FIG. 1, in accordance with one embodiment of the present invention. The host POR control circuit 103 includes a comparator 109 electrically connected to receive a divided version of the supply voltage VDDH at a first input (+) and the reference voltage (Vbg) at a second input (−). The divided version of the supply voltage VDDH is generated at node 111, which is connected to the first input (+) of the comparator 109. Resistors R3 and R4 divide the supply voltage VDDH to generate the voltage at node 111.

The comparator 109 is defined to compare the divided version of the supply voltage VDDH to the reference voltage Vbg to generate the comparator 109 output. When the divided version of the supply voltage VDDH at the first input (+), i.e., node 111, is at least as large as the reference voltage (Vbg) at the second input (−), the comparator 109 will generate a high digital state signal at the comparator 109 output (node 110). When the divided version of the supply voltage VDDH at the first input (+) is less than the reference voltage (Vbg), the comparator 109 will generate a low digital state signal at the comparator 109 output (node 110).

In one embodiment, the reference voltage (Vbg) at the second input (−) of the comparator 109 is about 0.5 V, and the host operational level of the supply voltage (VDDH) is about 1.6 V. In this embodiment, the resistors R3 and R4 can be defined to establish a voltage at node 111 of about 0.5 V when the supply voltage VDDH reaches about 1.4 V, thereby causing the comparator to output a high digital state signal at node 110 when the supply voltage VDDH reaches about 1.4 V.

The comparator 109 is electrically connected to receive electrical power from the supply voltage VDDH. The comparator 109 is defined to begin operation when the supply voltage VDDH reaches a comparator 109 operating voltage level, which occurs after the reference voltage (Vbg) is generated by the sub-volt bandgap reference voltage generator 101 and is received at the second input (−) of the comparator 109. In one embodiment, the comparator 109 operating voltage level is about 1.0 V, which means that the comparator 109 will not begin operation until the supply voltage VDDH reaches at least 1.0 V. Because the sub-volt bandgap reference voltage generator 101 will be fully functional with the supply voltage VDDH of at least 1.0 V, use of a comparator 109 operating voltage level of about 1.0 V will ensure that the reference voltage (Vbg) is generated and supplied to the second input (−) of the comparator 109 before the comparator 109 begins operation, thereby ensuring that the comparator will not prematurely output a high digital state signal at node 110 based on a incorrectly low reference voltage (Vbg).

The host POR control circuit 103 further includes an output stage 104 defined between the comparator 109 and the output node 105. More specifically, the output stage 104 receives as inputs the supply voltage VDDH, the output of the comparator 109, and a second reference voltage (Vbias) from the bandgap reference voltage generator 101. In turn, the output stage 104 is electrically connected to control the voltage at the output node 105. Also, the output stage 104 includes an electrical connection to a ground reference potential GND. The output node 105 is electrically connected to transmit a power-on reset control signal to the host/core circuitry. The digital state present at output node 105 serves as the master reset control, and is referred to as the Host Ready Signal. In the embodiment of FIG. 2, the Host Ready Signal is active high. Therefore, when the output node 105 maintains a high digital state, the reset signal is off, vice-versa. The output stage 104 is defined to guarantee that the output node 105 will be locked down, i.e., maintain a low digital state, until the supply voltage VDDH reaches the operational voltage level of the host/core circuitry.

The output stage 104 of the host POR control circuit 103 includes pulldown circuitry electrically connected between the comparator 109 output (node 110) and the Host Ready Signal output node 105. The pulldown circuitry includes a first pulldown transistor N1 electrically connected between the output node 105 and the ground reference potential GND. Activation of the first pulldown transistor N1 into a transmit state causes the output node 105 to be electrically connected to the ground reference potential GND. A gate of the first pulldown transistor N1 is electrically connected to both a second pulldown transistor N2 and a second divided version of the supply voltage VDDH at a node 107. The second divided version of the supply voltage VDDH at node 107 is generated by resistor R2 and capacitor C1. A gate of the second pulldown transistor N1 is electrically connected to the comparator 109 output node 110. In the embodiment of FIG. 2, both the first and second pulldown transistors N1 and N2 are defined as NMOS transistors. Therefore, activation of the second pulldown transistor N2 into a transmit state causes the gate of the first pulldown transistor N1 to be controlled such that the first pulldown transistor N1 is in a non-transmit state so as to electrically isolate the output node 105 from the ground reference potential GND.

The pulldown circuitry further includes a third pulldown transistor N3 electrically connected between the second pulldown transistor N2 and the ground reference potential GND. The third pulldown transistor N3 is also defined as an NMOS transistor. A gate of the third pulldown transistor N3 is electrically connected to receive the second reference voltage (Vbias) from the sub-volt bandgap reference voltage generator 101, such that the third pulldown transistor N3 is in a transmit state prior to activation of the second pulldown transistor N2 into the transmit state. In other words, the second reference voltage (Vbias) applies a high digital state signal to the gate of the third pulldown transistor N3 before the first divided voltage at node 111 reaches the level of the first reference voltage (Vbg). Therefore, the third pulldown transistor N3 serves as a backup to make sure that the sub-volt bandgap reference voltage generator 101 is really at its operating voltage level, and generating an accurate first reference voltage (Vbg), prior to allowing the comparator 109 to trigger shutdown of the first pulldown transistor N1.

Based on the description above, it should be understood that the pulldown circuitry operates in accordance with a digital signal state present at the comparator 109 output node 110 to control a voltage level present at the output node 105. A low digital state signal at the comparator 109 output node 110 causes the pulldown circuitry to electrically connect the output node 105 to the ground reference potential GND. In a complementary manner, a high digital state signal at the comparator 109 output node 110 causes the output node 105 to be electrically isolated from the ground reference potential GND, considering that the second reference voltage (Vbias) is already correctly set to turn on the third pulldown transistor N3. Thus, the pulldown circuitry is defined to maintain the output node 105 at a reset voltage level, i.e., low digital state signal, as the supply voltage VDDH rises to a host operational level based on a digital state signal present at the comparator 109 output node 110.

The output stage 104 of the host POR control circuit 103 includes pullup circuitry electrically connected between the supply voltage VDDH and the output node 105. The pullup circuitry is defined to maintain the output node 105 at a non-reset voltage level, i.e., high digital state signal, after the supply voltage VDDH has risen to the host operational level. The non-reset voltage level at node 105 is governed by a resistor R1 and the supply voltage VDDH, when the supply voltage VDDH is at the host operational level. It should be understood that electrical isolation of the output node 105 from the ground reference potential GND in accordance with the high digital state signal at the comparator 109 output node 110 enables the pullup circuitry to maintain the output node 105 at the non-reset voltage level.

As previously mentioned, the bandgap reference voltage generator 101 is defined and electrically connected to supply the reference voltage (Vbg) to the second input (−) of the comparator 109, and to supply the second reference voltage (Vbias) to the gate of the third pulldown transistor N3. The bandgap reference voltage generator 101 is electrically connected to receive electrical power from the supply voltage VDDH. Also, because the bandgap reference voltage generator 101 is a sub-volt bandgap reference voltage generator and is defined to self-start when the supply voltage VDDH reaches the self-start voltage level below 1.0 V, the bandgap reference voltage generator 101 is defined to supply the reference voltage (Vbg) to the second input (−) of the comparator 109 before the comparator 109 begins operation to compare the divided version of the supply voltage at its first input (+), i.e., at node 111, to the reference voltage (Vbg) at its second input (−). Therefore, the bandgap reference voltage generator 101 operating voltage level is less than the comparator 109 operating voltage level.

Figure 3:
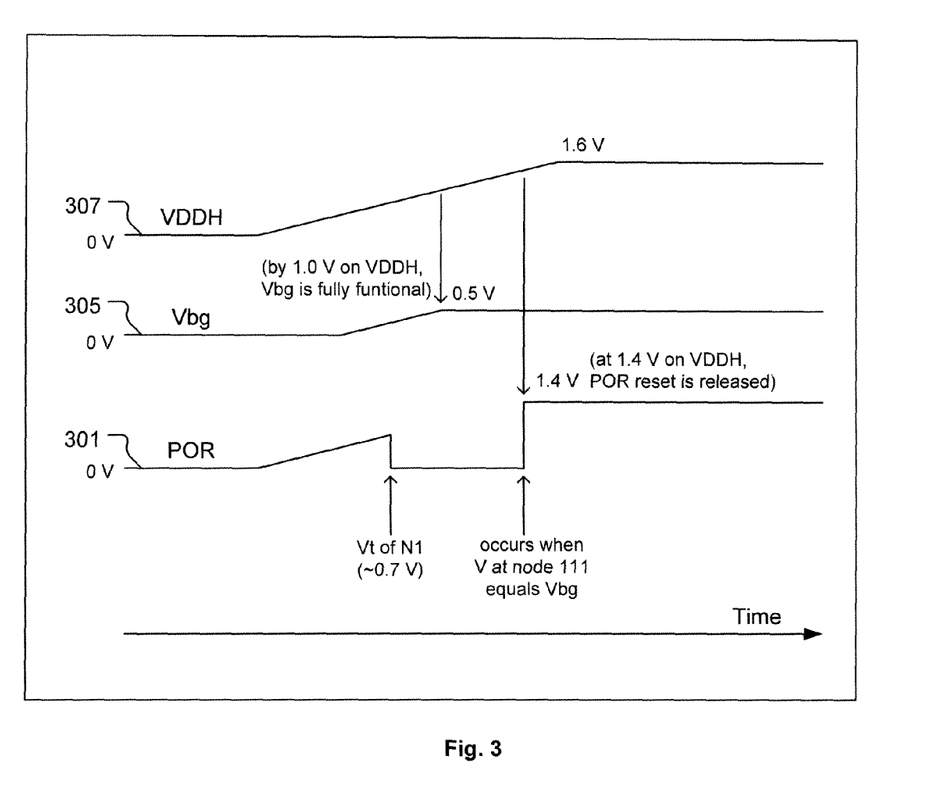
FIG. 3 shows waveforms associated with the POR control circuit of FIGS. 1 and 2, in accordance with one embodiment of the present invention.

FIG. 3 shows waveforms associated with the host POR control circuit of FIGS. 1 and 2, in accordance with one embodiment of the present invention. A waveform 301 represents a voltage level at the output node 105 as a function of time. A waveform 305 represents a voltage level of the first reference voltage supplied to the second input (−) of the comparator 109 as a function of time. A waveform 307 represents a voltage level of the supply voltage VDDH as a function of time.

As the supply voltage VDDH ramps up from 0 V to a threshold voltage (Vt) of the first pulldown transistor N1 (e.g., about 0.7 V) at node 107, the voltage of output node 105 will ramp up in a following manner. Then, when the supply voltage VDDH reaches the threshold voltage (Vt) of the first pulldown transistor N1 at node 107, the first pulldown transistor N1 will turn on, thereby pulling output node 105 down to the ground reference potential GND.

As the supply voltage VDDH continues to ramp up, the comparator 109 condition will eventually be satisfied when the divided version of the supply voltage VDDH at node 111 equals the first reference voltage (Vbg), and the comparator 109 output node 110 will go to a high digital state so as to turn on the second pulldown transistor N2. Thus, the voltage level at node 111 needs to reach the first reference voltage (Vbg) in order for the comparator 109 to output a high digital state signal to cause the second pulldown transistor N2 to turn on. In one embodiment, the first reference voltage (Vbg) is 0.5 V, and the voltage level at node 111 will reach 0.5 V when the supply voltage VDDH is 1.4 V. In this embodiment, the reset signal at output node 105 has a 1.4 V trip point.

Before the comparator 109 output turns on the second pulldown transistor N2, the third pulldown transistor N3 is already turned on by the second reference voltage (Vbias). In one embodiment, the second reference voltage (Vbias) is about 0.75 V. Therefore, a path to the ground reference potential GND from the second pulldown transistor N2 is already present before the comparator 109 output causes the second pulldown transistor N2 to turn on. Consequently, when the comparator 109 output at node 110 causes the second pulldown transistor N2 to turn on, the node 107 will be pulled down to the ground reference potential GND, which will cause the first pulldown transistor N1 to turn off, thereby allowing the output node 105 to jump to the current supply voltage VDDH level.

The third pulldown transistor N3 serves as a backup to make sure that the bandgap reference voltage generator 101 is really at its operating voltage level. Hence, for the first pulldown transistor N1 to be turned off so as to release the reset signal at node 105, the comparator 109 condition has to be satisfied by the divided version of the supply voltage VDDH relative to the first reference voltage (Vbg), and the bandgap reference voltage generator 101 has to be generating sufficient voltage as evidenced by the transmission state of the third pulldown transistor N3.

Figure 4:
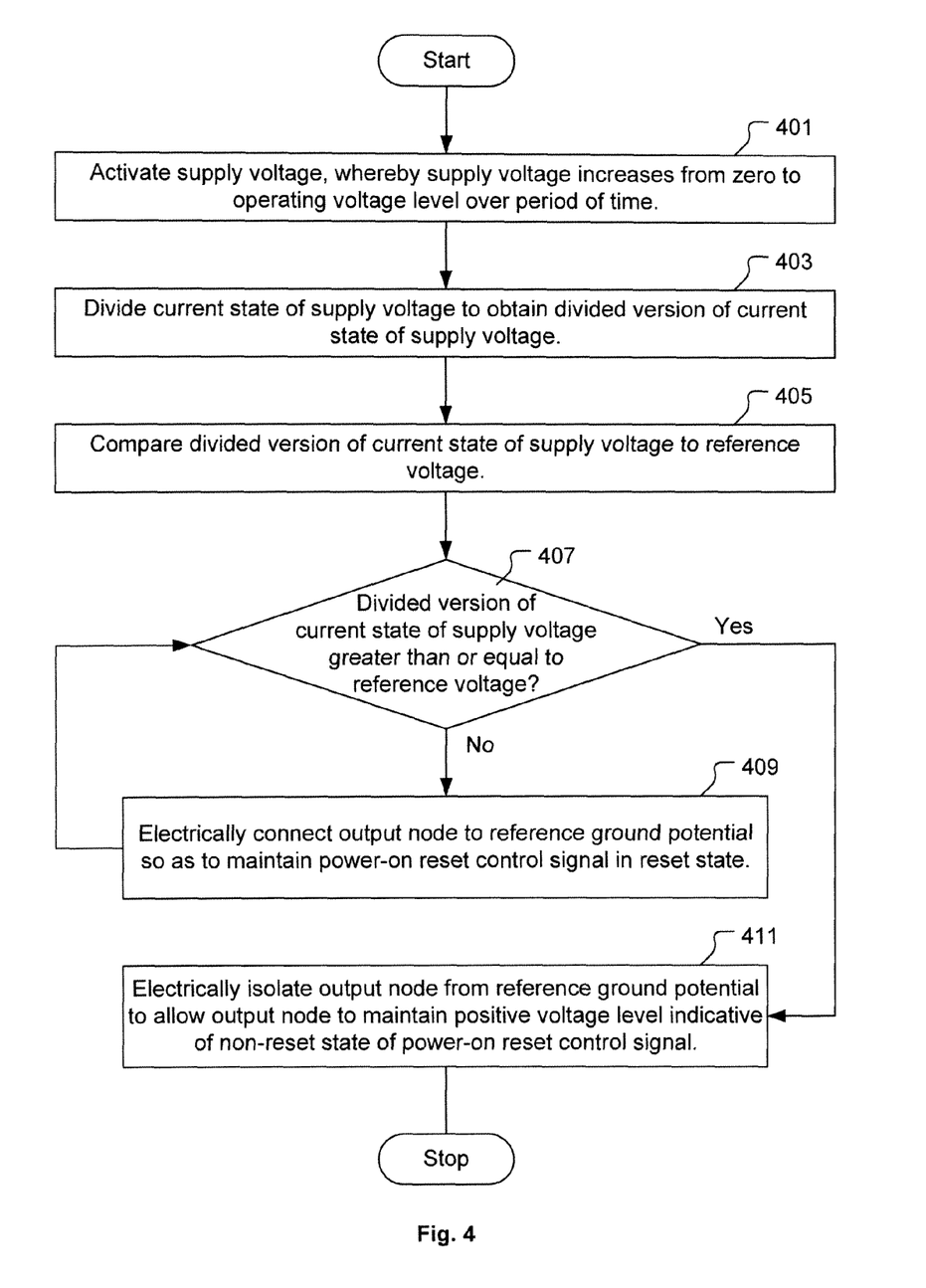
FIG. 4 shows a flowchart of a method for controlling power-on reset of an electronic device, in accordance with one embodiment of the present invention.

FIG. 4 shows a flowchart of a method for controlling power-on reset of an electronic device, in accordance with one embodiment of the present invention. The method includes an operation 401 for activating a supply voltage (e.g., VDDH) whereby the supply voltage increases from zero to an operating voltage level over a period of time. The method also includes an operation 403 for dividing a current state of the supply voltage to obtain a divided version of the current state of the supply voltage (e.g., the divided version of the supply voltage VDDH at node 111). The method further includes an operation 405 for comparing the divided version of the current state of the supply voltage to a reference voltage (e.g., comparing the voltage at node 111 to the first reference voltage (Vbg)).

From the operation 405, the method proceeds with a decision operation 407 to determine whether or not the divided version of the current state of the supply voltage is greater than or equal to the reference voltage. If the divided version of the current state of the supply voltage is less than the reference voltage (e.g., the voltage at node 111 is less than the first reference voltage (Vbg)), the method proceeds with an operation 409 in which an output node (e.g., output node 105) is electrically connected to a ground reference potential (e.g., GND). In the present method, the output node is electrically connected to transmit a power-on reset control signal. Connection of the output node to the ground reference potential in operation 409 maintains the power-on reset control signal in a reset state.

If the divided version of the current state of the supply voltage is greater than or equal to the reference voltage (e.g., the voltage at node 111 is greater than or equal to the first reference voltage (Vbg)), the method proceeds with an operation 411 in which the output node (e.g., output node 105) is electrically isolated from the ground reference potential (e.g., GND). Isolation of the output node from the ground reference potential allows the output node to maintain a positive voltage level indicative of a non-reset state of the power-on reset control signal. The method can further include an operation for maintaining a connection of the output node to the supply voltage so as to maintain the positive voltage level indicative of the non-reset state of the power-on reset control signal when the output node is isolated from the ground reference potential.

Additionally, the method can include operations for transmitting the supply voltage to a bandgap reference voltage generator, and operating the bandgap reference voltage generator based on the received supply voltage to generate the reference voltage used for comparison in operation 405. In one embodiment, the bandgap reference voltage generator is a sub-volt bandgap reference voltage generator defined to self-start when the received supply voltage reaches a self-start voltage level. The self-start voltage level is defined such that the bandgap reference voltage generator operates to generate the reference voltage before the divided version of the current state of the supply voltage is compared to the reference voltage in operation 405.

The method can further include operations for transmitting the supply voltage to a comparator, and operating the comparator based on the received supply voltage perform operation 405. In this instance, the comparator will operate to compare the divided version of the current state of the supply voltage to the reference voltage and generate a comparator digital output signal indicative of a comparison result. Again, it should be understood that the comparator is operated to compare the divided version of the current state of the supply voltage to the reference voltage after the bandgap reference voltage generator is operated to generate the reference voltage. The comparator generates a high state digital output signal when the divided version of the current state of the supply voltage is at least as large as the reference voltage. The comparator generates a low state digital output signal when the divided version of the current state of the supply voltage is less than the reference voltage.

The method can also include operating pulldown circuitry in accordance with the comparator digital output signal to electrically connect the output node to the ground reference potential, while the divided version of the current state of the supply voltage is less than the reference voltage. Also, the method can include operating the pulldown circuitry in accordance with the comparator digital output signal to electrically isolate the output node from the ground reference potential, while the divided version of the current state of the supply voltage is greater than or equal to the reference voltage.

It should be appreciated that a POR circuit is necessary in mixed-signal systems to initialize logic elements in the integrated circuitry to a known state prior to when the supply voltage is first applied to the integrated circuitry. The POR circuit outputs a reset signal to logic elements, e.g., latches, flip-flops or other sequential circuits, until a predetermined threshold supply voltage is reached after power up. Thus, the POR circuit prevents abnormal behavior of core logic circuits, which would otherwise lead to failure or inoperability of the system. The POR control circuit disclosed herein guarantees a steady reset pulse at the output node and an accurate trip point voltage with minimum dependency on process, temperature, and supply voltage ramp profile.

The invention described herein can be embodied as computer readable code on a computer readable medium. For example, the computer readable code can include a layout data file within which one or more layouts corresponding to system 100 and/or host POR control circuit 103 are stored. The computer readable medium mentioned herein is any data storage device that can store data which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network of coupled computer systems so that the computer readable code is stored and executed in a distributed fashion.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments of the present invention can also be defined as a machine that transforms data from one state to another state. The data may represent an article, that can be represented as an electronic signal and electronically manipulate data. The transformed data can, in some cases, be visually depicted on a display, representing the physical object that results from the transformation of data. The transformed data can be saved to storage generally, or in particular formats that enable the construction or depiction of a physical and tangible object. In some embodiments, the manipulation can be performed by a processor. In such an example, the processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

It should be further understood that the POR system and control circuit as disclosed herein can be manufactured as part of a semiconductor device or chip. In the fabrication of semiconductor devices such as integrated circuits, memory cells, and the like, a series of manufacturing operations are performed to define features on a semiconductor wafer. The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

What is claimed is:

1. A host power-on reset control circuit, comprising:
   a comparator electrically connected to receive a divided version of a supply voltage at a first input and a reference voltage at a second input, the comparator defined to generate a high digital state signal at a comparator output when the divided version of the supply voltage at the first input is at least as large as the reference voltage at the second input;

an output node electrically connected to transmit a power-on reset control signal;

pulldown circuitry electrically connected between the comparator output and the output node, the pulldown circuitry defined to maintain the output node at a reset voltage level as the supply voltage rises to a predetermined threshold level based on a digital state signal present at the comparator output, wherein the pulldown circuitry includes a first pulldown transistor electrically connected between the output node and a ground reference potential, wherein activation of the first pulldown transistor into a transmit state causes the output node to be electrically connected to the ground reference potential, wherein a gate of the first pulldown transistor is electrically connected to a second pulldown transistor and to a first terminal of a resistor and to a first terminal of a capacitor, wherein both a second terminal of the resistor is connected to the supply voltage and a second terminal of the capacitor is connected to the supply voltage such that a second divided version of the supply voltage is provided to the gate of the first pulldown transistor, wherein a gate of the second pulldown transistor is electrically connected to the comparator output, wherein activation of the second pulldown transistor into a transmit state causes the gate of the first pulldown transistor to be controlled such that the first pulldown transistor is in a non-transmit state so as to electrically isolate the output node from the ground reference potential, wherein the pulldown circuitry further includes a third pulldown transistor electrically connected between the second pulldown transistor and the ground reference potential, a gate of the third pulldown transistor electrically connected to receive a second reference voltage such that the third pulldown transistor is in a transmit state prior to activation of the second pulldown transistor into the transmit state; and pullup circuitry electrically connected between the supply voltage and the output node, the pullup circuitry defined to maintain the output node at a non-reset voltage level after the supply voltage has risen to the host operational level, wherein a low digital state signal at the comparator output causes the pulldown circuitry to electrically connect the output node to a ground reference potential, and wherein the high digital state signal at the comparator output causes the output node to be electrically isolated from the ground reference potential.

2. A host power-on reset control circuit as recited in claim 1, wherein electrical isolation of the output node from the ground reference potential in accordance with the high digital state signal at the comparator output enables the pullup circuitry to maintain the output node at the non-reset voltage level.

3. A host power-on reset control circuit as recited in claim 1, further comprising:

a bandgap reference voltage generator defined and electrically connected to supply the reference voltage to the second input of the comparator and to supply the second reference voltage to the gate of the third pulldown transistor, the bandgap reference voltage generator electrically connected to receive electrical power from the supply voltage, and wherein the bandgap reference voltage generator is defined to supply the reference voltage to the second input of the comparator before the comparator begins operation to compare the divided version of the supply voltage at its first input to the reference voltage at its second input.

4. A host power-on reset control circuit as recited in claim 3, wherein the bandgap reference voltage generator is defined to begin operation when the supply voltage reaches a bandgap reference voltage generator operating voltage level, and wherein the comparator is electrically connected to receive electrical power from the supply voltage, and wherein the comparator is defined to begin operation when the supply voltage reaches a comparator operating voltage level, wherein the bandgap reference voltage generator operating voltage level is less than the comparator operating voltage level.

5. A host power-on reset control circuit as recited in claim 3, wherein the bandgap reference voltage generator is a sub-volt bandgap reference voltage generator and is defined to self-start when the supply voltage reaches a self-start voltage level.

6. A host power-on reset control circuit as recited in claim 1, wherein the reference voltage at the second input of the comparator is about 0.5 V, and wherein the host operational level of the supply voltage is about 1.6 V.

7. A host power-on reset control circuit as recited in claim 1, wherein the comparator is electrically connected to receive electrical power from the supply voltage, and wherein the comparator is defined to begin operation when the supply voltage reaches a comparator operating voltage level after the reference voltage is received at the second input of the comparator.

8. A method for controlling power-on reset of an electronic device, comprising:

activating a supply voltage such that the supply voltage increases from zero to an operating voltage level over a period of time;

transmitting the supply voltage to a comparator;

dividing a current state of the supply voltage to obtain a divided version of the current state of the supply voltage;

operating the comparator based on the received supply voltage to compare the divided version of the current state of the supply voltage to a reference voltage and generate a comparator digital output signal indicative of a comparison result, wherein the comparator generates a high state digital output signal when the divided version of the current state of the supply voltage is at least as large as the reference voltage, and wherein the comparator generates a low state digital output signal when the divided version of the current state of the supply voltage is less than the reference voltage;

operating pulldown circuitry in accordance with the comparator digital output signal to electrically connect an output node to a ground reference potential while the comparator generates the low state digital output signal, wherein operating the pulldown circuitry includes operating a first pulldown transistor electrically connected between the output node and the ground reference potential such that activation of the first pulldown transistor into a transmit state causes the output node to be electrically connected to the ground reference potential, wherein a gate of the first pulldown transistor is electrically connected to a second pulldown transistor and to a first terminal of a resistor and to a first terminal of a capacitor, wherein both a second terminal of the resistor is connected to the supply voltage and a second terminal of the capacitor is connected to the supply voltage such that a second divided version of the supply voltage is provided to the gate of the first pulldown transistor, wherein operating the pulldown circuitry includes operating a second pulldown transistor having a gate electrically connected to the comparator output, such that activation of the second pulldown transistor into a transmit state causes the gate of the first pulldown transistor to be controlled such that the first pulldown transistor is in a non-transmit state so as to electrically isolate the output node from the ground reference potential, wherein operating the pulldown circuitry further includes operating a third pulldown transistor electrically connected between the second pulldown transistor and the ground reference potential, wherein operating the third pulldown transistor includes providing a second reference voltage to a gate of the third pulldown transistor such that the third pulldown transistor is in a transmit state prior to activation of the second pulldown transistor into the transmit state, wherein the output node is electrically connected to transmit a power-on reset control signal, wherein connection of the output node to the ground reference potential maintains the power-on reset control signal in a reset state; and electrically isolating the output node from the ground reference potential while the comparator generates the high state digital output signal, wherein isolation of the output node from the ground reference potential allows the output node to maintain a positive voltage level indicative of a non-reset state of the power-on reset control signal.

9. A method for controlling power-on reset of an electronic device as recited in claim 8, further comprising:
transmitting the supply voltage to a bandgap reference voltage generator; and
operating the bandgap reference voltage generator based on the received supply voltage to generate the reference voltage,
wherein the bandgap reference voltage generator is a sub-volt bandgap reference voltage generator and self-starts when the received supply voltage reaches a self-start voltage level, and
wherein the self-start voltage level is defined such that the bandgap reference voltage generator operates to generate the reference voltage before the divided version of the current state of the supply voltage is compared to the reference voltage.

10. A method for controlling power-on reset of an electronic device as recited in claim 9, wherein the comparator is operated to compare the divided version of the current state of the supply voltage to the reference voltage after the bandgap reference voltage generator is operated to generate the reference voltage.

11. A method for controlling power-on reset of an electronic device as recited in claim 10, further comprising:
operating the pulldown circuitry in accordance with the comparator digital output signal to electrically connect the output node to the ground reference potential while the divided version of the current state of the supply voltage is less than the reference voltage; and
operating the pulldown circuitry in accordance with the comparator digital output signal to electrically isolate the output node from the ground reference potential while the divided version of the current state of the supply voltage is greater than or equal to the reference voltage.

12. A method for controlling power-on reset of an electronic device as recited in claim 8, further comprising:
maintaining a connection of the output node to the supply voltage so as to maintain the positive voltage level indicative of the non-reset state of the power-on reset control signal when the output node is isolated from the ground reference potential.

\* \* \* \* \*